United States Patent
Nasu et al.

(10) Patent No.: US 10,834,812 B2
(45) Date of Patent: Nov. 10, 2020

(54) WIRING BOARD

(71) Applicant: NGK SPARK PLUG CO., LTD., Nagoya (JP)

(72) Inventors: Takakuni Nasu, Nagoya (JP); Yousuke Kondou, Nagoya (JP); Masaomi Hattori, Nagoya (JP); Kouta Kimata, Nagoya (JP); Atsushi Kaga, Nagoya (JP); Guangzhu Jin, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/523,476

(22) Filed: Jul. 26, 2019

(65) Prior Publication Data
US 2020/0077512 A1    Mar. 5, 2020

(30) Foreign Application Priority Data
Aug. 29, 2018   (JP) .................. 2018-160480

(51) Int. Cl.
| | |
|---|---|
| H05K 1/11 | (2006.01) |
| H05K 1/02 | (2006.01) |
| G01R 1/073 | (2006.01) |
| G01R 31/28 | (2006.01) |
| H01L 23/498 | (2006.01) |
| H05K 1/03 | (2006.01) |

(52) U.S. Cl.
CPC ....... *H05K 1/0271* (2013.01); *G01R 1/07314* (2013.01); *G01R 1/07342* (2013.01); *G01R 31/2831* (2013.01); *G01R 31/2889* (2013.01); *H01L 23/49822* (2013.01); *H05K 1/0298* (2013.01); *H05K 1/0306* (2013.01); *H05K 1/111* (2013.01)

(58) Field of Classification Search
CPC .............. H05K 1/0271; G01R 1/07314; G01R 1/07342; G01R 31/2831; G01R 31/2889; H01L 23/49822
USPC ........................................................ 174/255
See application file for complete search history.

(56) References Cited

U.S. PATENT DOCUMENTS

| | | | |
|---|---|---|---|
| 9,903,887 B2 | 2/2018 | Nasu et al. | |
| 2010/0031504 A1* | 2/2010 | Park ..................... | H05K 3/4007 29/874 |
| 2017/0012298 A1 | 1/2017 | Breault et al. | |

FOREIGN PATENT DOCUMENTS

JP    2017-90067 A    5/2017

* cited by examiner

*Primary Examiner* — Tremesha S Willis
(74) *Attorney, Agent, or Firm* — Stites & Harbison, PLLC; Jeffrey A. Haeberlin; Gary N. Stewart

(57) ABSTRACT

A wiring board includes: a ceramic board including a ceramic insulator layer composed mainly of ceramic, and a wiring disposed at the ceramic insulator layer; a first resin board and a second resin board each of which includes a resin insulator layer composed mainly of resin, and a wiring disposed at the resin insulator layer; and a metal member mounted to the second resin board. The first resin board is superposed to a first surface of the ceramic board. The second resin board is superposed to a second surface of the ceramic board opposite to the first surface of the ceramic board. The second resin board includes a joint pad at its first surface opposite to its second surface facing the ceramic board, the joint pad made of metal. The metal member is joined to the joint pad by brazing or soldering.

4 Claims, 3 Drawing Sheets

WIRING BOARD

BACKGROUND

The present disclosure relates to a wiring board.

Japanese Patent Application Publication 2017-90067 A, corresponding to U.S. Pat. No. 9,903,887 B2, discloses a wiring board for a probe card. The probe card is a jig for electrical inspection of a wafer in which semiconductor elements are formed. The probe card includes the probe card wiring board to which probes are mounted. The probe card wiring board is composed of a ceramic board and a resin board superposed with the ceramic board. The resin board includes pads for mounting the probes thereto.

Such probe card wiring board may undergo a displacement in positions of probes and a decrease in precision of inspection, due to a small distortion in a ceramic board etc. For removing the distortion and fixing the probe card wiring board to a test head of inspector, the probe card wiring board includes screws serving as fixing tools, for example.

Thus fixing the wiring board to the test head by the screws serves to remove the distortion and suppress the wiring board from undergoing the position displacement with respect to a wafer to be inspected.

SUMMARY

The probe card wiring board described above may warp due to variation in temperature, because of a large difference in thermal expansion coefficient between the ceramic board and the resin board. The warp can be suppressed from occurring, by providing the resin boards to both sides of the ceramic board.

The probe card wiring board with the resin boards at the both sides of the ceramic board includes the screws mounted to the resin board. However, when the screws are joined to the resin board by a resin-based adhesive, the adhesive is likely to deteriorate, and the screws are likely to decrease in strength of the joint, through heat cycles including a repeat of heating and cooling.

The decrease in joint strength of metal parts may occur also in a wiring board for devices other than probe cards, the metal parts mounted to a resin board superposed with a ceramic board of the wiring board.

In view of the foregoing, it is desirable to suppress the entire wiring board including the ceramic board from warping, and simultaneously improve the wiring board in joint strength of the metal parts.

According one aspect of the present disclosure, a wiring board comprises: a ceramic board including a ceramic insulator layer composed mainly of ceramic, and a wiring disposed at the ceramic insulator layer; a first resin board and a second resin board each of which includes a resin insulator layer composed mainly of resin, and a wiring disposed at the resin insulator layer; and a metal member mounted to the second resin board, wherein: the first resin board is superposed to a first surface of the ceramic board; the second resin board is superposed to a second surface of the ceramic board opposite to the first surface of the ceramic board; the second resin board includes a joint pad at its first surface opposite to its second surface facing the ceramic board, the joint pad made of metal; and the metal member is joined to the joint pad by brazing or soldering.

DETAILED DESCRIPTION

The following describes the embodiment of the present disclosure, with reference to the drawings.

Figure 1:
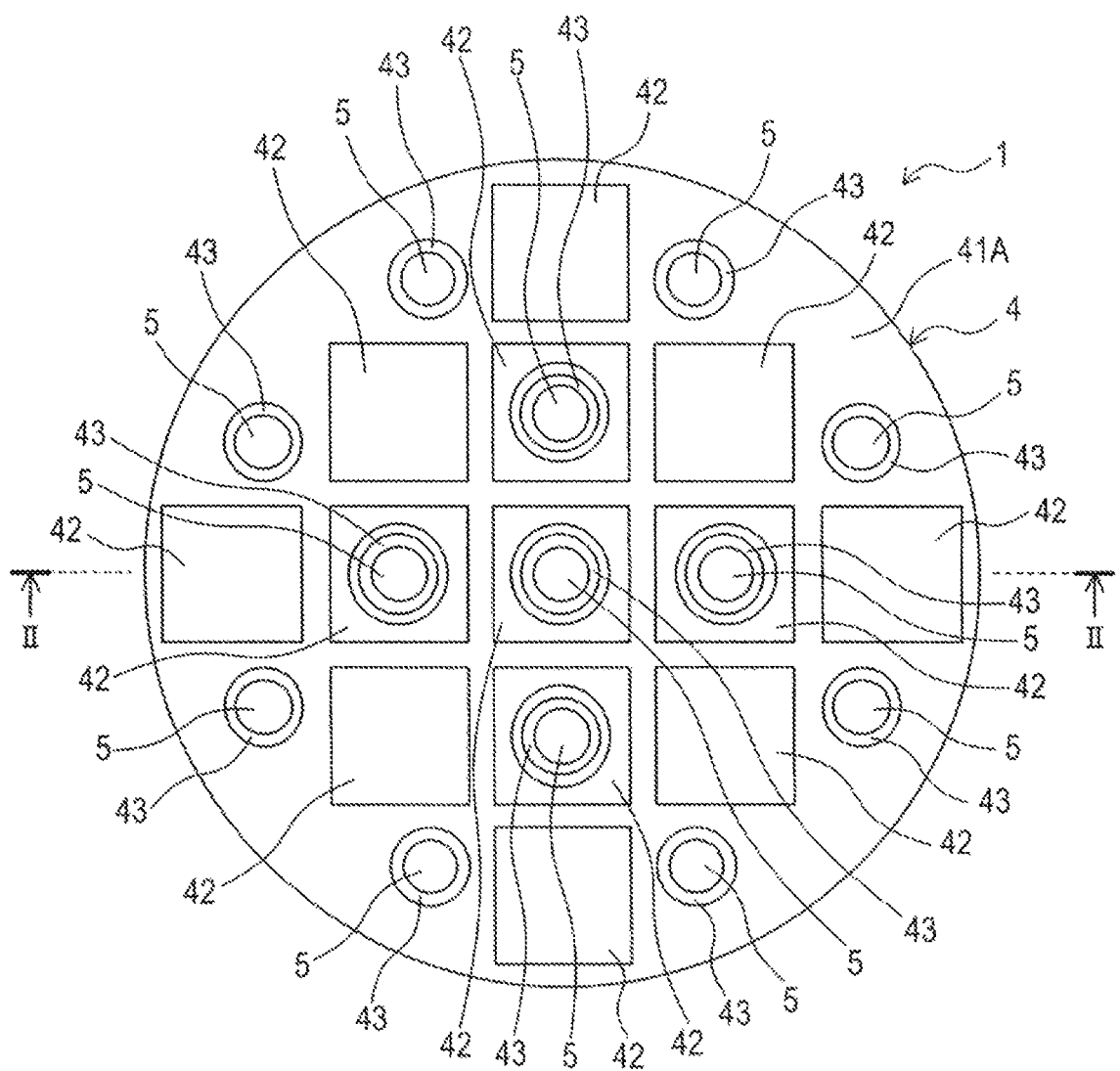
FIG. 1 is a schematic plan view of a wiring board according to embodiment of the present disclosure.
Figure 2:
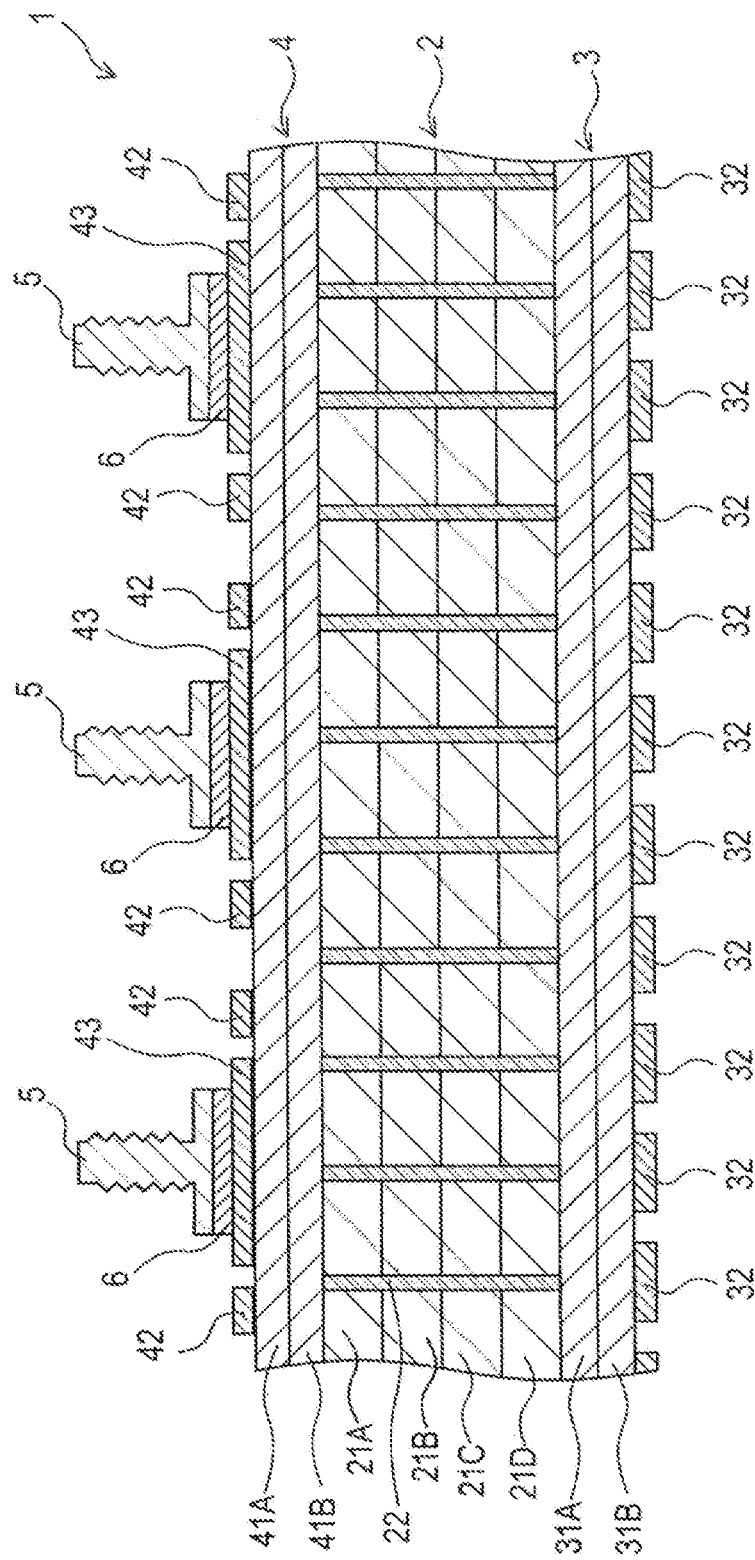
FIG. 2 is a schematic partial sectional view of the wiring board along a line II-II shown in FIG. 1.

A wiring board 1 shown in FIGS. 1 and 2 includes a ceramic board 2, a first resin board 3, a second resin board 4, and metal members 5.

The wiring board 1 according to the present embodiment is a wiring board for a probe card employed in electrical inspection of a wafer in which semiconductor elements are formed. The wiring board 1 is to be provided with probes mounted thereto, upon the wafer inspection. Although the wiring board 1 has a circular shape in FIG. 1, the shape of the wiring board 1 is not limited to a circle but may be designed appropriately in accordance with a shape of a wafer to be inspected.

<Ceramic Board> The ceramic board 2 includes ceramic insulator layers 21A, 21B, 21C, and 21D composed mainly of ceramic, and wirings disposed at the ceramic insulator layers 21A, 21B, 21C, and 21D.

The main component mentioned above means a component accounting 90% in mass. Incidentally, although the ceramic insulator layers are four in number in FIG. 2, the number is not limited to four, but may be one.

FIG. 2 shows conductors 22 only, out of the wirings of the ceramic board 2. The conductors 22 extend through the ceramic insulator layers in a thickness direction thereof, and serve as vias. Each of the conductors 22 electrically connects wirings of the first resin board 3 to wirings of the second resin board 4.

The wirings of the ceramic board 2 are made of metal such as tungsten (W), molybdenum (Mo), manganese (Mn), copper (Cu), silver (Ag), and alloy of these metals. Tungsten is especially preferable in view of heat resistance during firing.

The ceramic insulator layers may be made of any kind of ceramic such as alumina, low temperature co-fired ceramic (LTCC), and middle temperature co-fired ceramic (MTCC). Especially, alumina and LTCC are preferable. Employment of alumina serves to reduce a cost for manufacturing the ceramic board 2. Employment of LTCC serves to lower a firing temperature of the ceramic board 2, and allow copper alloy such as Cu—W to be employed for the wirings. This serves to reduce the manufacturing cost of the ceramic board 2 and improve the wirings in conductivity.

Each of the ceramic insulator layers preferably has a thermal expansion coefficient within a range of $3\times10^{-6}$ m/K to $6\times10^{-6}$ m/K. When the thermal expansion coefficient exceeds the range, the wiring board 1 may easily warp due to a difference in thermal expansion between the first resin board 3 and the second resin board 4.

<First Resin Board> The first resin board 3 includes resin insulator layers 31A and 31B composed mainly of resin, and the wirings disposed at the resin insulator layers 31A and 31B. FIG. 2 shows probe pads 32 only, out of the wirings of the first resin board 3.

The first resin board 3 is superposed to a first surface of the ceramic board 2. In detail, the first resin board 3 is joined to the first surface of the ceramic board 2 by fusion of a heat fusion layer provided to the first resin board 3 at its one surface facing the ceramic board 2.

Although the resin insulator layers of the first resin board 3 are two in number in FIG. 2, the number is not limited to two, but may be one. The resin insulator layers of the first resin board 3 are mainly composed of resin that does not melt during brazing or soldering of the metal members 5 described below (the resin higher in melting point than a brazing material or a soldering material). Such resin is exemplified by polyimide preferred in view of chemical resistance.

The wirings of the first resin board 3 include, in addition to the probe pads 32, conductors extending through the resin insulator layers, and wirings disposed at surfaces of the respective resin insulator layers. The wirings of the first resin board 3 are made of metal such as W, Mo, Mn, Cu, Ag, and alloy of these metals.

Each of the probe pads 32 serves as a terminal to which a probe for the wafer inspection is mounted. Each of the probe pads 32 is electrically connected to a corresponding one of electrode pads 42 of the second resin board 4 described below, via the wirings in the first resin board 3 and the wirings of the ceramic board 2 and the wirings in the second resin board 4.

<Second Resin Board> The second resin board 4 includes resin insulator layers 41A and 41B composed mainly of resin, and the wirings disposed at the resin insulator layers 41A and 41B, and joint pads 43. FIG. 2 shows the electrode pads 42 only, out of the wirings of the second resin board 4.

The second resin board 4 is superposed to a second surface of the ceramic board 2 opposite to the first surface of the ceramic board 2 to which the first resin board 3 is superposed. In detail, the second resin board 4 is joined to the second surface of the ceramic board 2 by fusion of a heat fusion layer provided to the second resin board 4 at its one surface facing the ceramic board 2.

Although the resin insulator layers of the second resin board 4 are two in number in FIG. 2, the number is not limited to two, but may be one. The resin insulator layers of the second resin board 4 may be mainly composed of the same resin with one for the resin insulator layers of the first resin board 3. Polyimide is especially preferred as the main component of the resin insulator layers in view of chemical resistance.

The wirings of the second resin board 4 include, in addition to the electrode pads 42, conductors extending through the resin insulator layers, and wirings disposed at surfaces of the respective resin insulator layers. The wirings of the second resin board 4 are made of metal such as W, Mo, Mn, Cu, Ag, and alloy of these metals.

Figure 3:
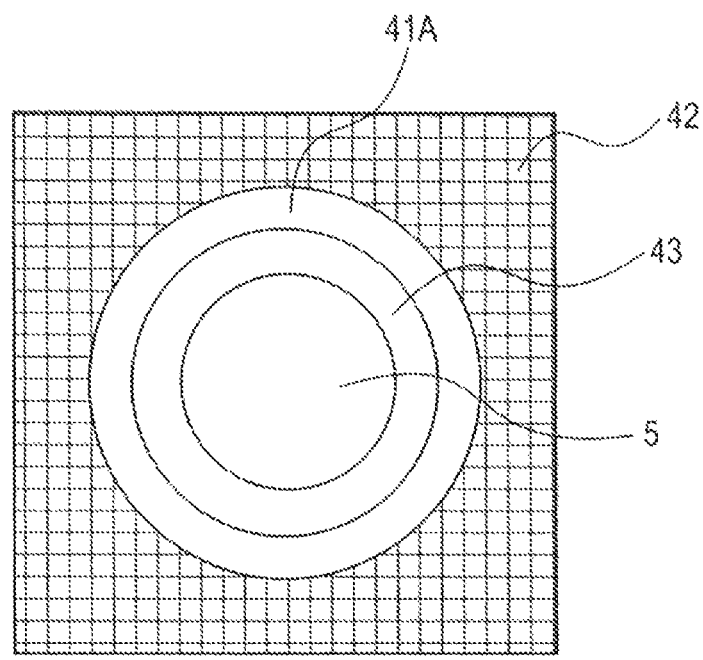
FIG. 3 is a schematic partial plan view enlarging a joint pad of the wiring board shown in FIG. 1.

As shown in FIG. 3, each of the electrode pads 42 is a so-called Land Grid Array (LGA) in which plane electrode pads are arranged in grid. Each of the plane electrode pads corresponds to a semiconductor element to be inspected.

The joint pads 43 are disposed at a first surface of the second resin board 4 opposite to a second surface of the second resin board 4 facing the ceramic board 2: in other words, disposed at an exposed surface of the resin insulator layer 41A. Each of the joint pads 43 is joined to one of the metal members 5 described below.

The joint pads 43 are made of metal that is preferably the same material with one for the wirings of the second resin board 4. This allows the joint pads 43 to be formed simultaneously with other parts such as the electrode pads 42.

The joint pads 43 are electrically disconnected with the wirings of the second resin board 4. As shown in FIG. 3, the joint pad 43 is arranged apart from the electrode pad 42 surrounding the joint pad 43, on the resin insulator layer 41A being an outermost layer.

In FIG. 1, some of the joint pads 43 are arranged to be respectively surrounded by corresponding ones of the electrode pads 42, and the other of the joint pads 43 are arranged outside of the electrode pads 42. This is only an example. The joint pads 43 have a plan shape that is not limited to a circle. The arrangement and the shape of the joint pads 43 may be arbitrarily designed.

<Metal Members> The metal members 5 are made of metal, at least regarding their surfaces. According to the present embodiment, the metal members 5 are fixing tools for fixing the wiring board 1 to a test head of inspector: specifically, metal screws. The metal members 5 may be fixing tools other than screws.

The metal members 5 are preferably made of material less in thermal expansion coefficient for maintaining the wiring board 1 in positional accuracy, although the material is not particularly limited. Such material is exemplified by kovar (Ni—Co alloy).

As shown in FIG. 2, each of the metal members 5 is joined by brazing or soldering to a corresponding one of the joint pads 43 via a joint metal 6. The joint metals 6 are brazing materials or soldering materials. The brazing materials or soldering materials are preferably ones less in melting point than the first resin board 3 and the second resin board 4, such as AuSn.

<Manufacturing Method> The wiring board 1 is manufactured, for example, by a method including: a process for forming the ceramic board 2; a process for joining the first resin board 3 and the second resin board 4 to the ceramic board 2; and a process for mounting the metal members 5 to the second resin board 4.

In the process for forming the ceramic board 2, ceramic green sheets unfired are prepared, and conductive paste is printed to the respective ceramic green sheets. The ceramic green sheets are stacked and fired, and form the ceramic board 2.

In the process for joining the first resin board 3 and the second resin board 4 to the ceramic board 2, a first step is preparing the first resin board 3 and the second resin board 4 in each of which the wirings are formed by a known method. Next, the first resin board 3 and the second resin board 4 are stacked with the ceramic board 2 via the heat fusion layers. Then, this stack is heated and pressed, and thereby the first resin board 3 and the second resin board 4 are joined with the ceramic board 2. The ceramic board 2 may include, at its joint surface, a metal pad as an anchor wherein surfaces of the metal pad have been roughened by etching.

In the process for mounting the metal members 5 to the second resin board 4, each of the metal members 5 is first placed at a corresponding one of the joint pads 43 of the second resin board 4 joined to the ceramic board 2, while interposing the brazing material or the soldering material therebetween. Then, these are heated at a temperature equal to or higher than a melting point of the brazing material or the soldering material, and the metal members 5 are joined to the joint pads 43.

The following summarizes features of the above embodiment.

A wiring board (1) includes: a ceramic board (2) including a ceramic insulator layer (21A, 21B, 21C, 21D) composed mainly of ceramic, and a wiring disposed at the ceramic insulator layer (21A, 21B, 21C, 21D); a first resin board (3) and a second resin board (4) each of which includes a resin insulator layer (31A, 31B, 41A, 41B) composed mainly of resin, and a wiring disposed at the resin insulator layer (31A, 31B, 41A, 41B); and a metal member (5) mounted to the second resin board (4); wherein: the first resin board (3) is superposed to a first surface of the ceramic board (2); the second resin board (4) is superposed to a second surface of the ceramic board (2) opposite to the first surface of the ceramic board (2); the second resin board (4) includes a joint pad (43) at its first surface opposite to its second surface facing the ceramic board (2), the joint pad (43) made of metal; and the metal member (5) is joined to the joint pad (43) by brazing or soldering.

According to this configuration, the entire wiring board (1) is suppressed from warping, by interposing the ceramic board (2) between the first resin board (3) and the second resin board (4). Furthermore, the metal members (5) are suppressed from decreasing in joint strength through heat cycles, by brazing or soldering the metal members (5) to the second resin board (4).

According to one aspect of the present disclosure, the resin insulator layers (31A, 31B, 41A, 41B) of the first resin board (3) and the second resin board (4) are mainly composed of polyimide. This configuration serves to ensure the resin insulator layers (41A, 41B) in heat resistance during the brazing or soldering of the metal members (5), and simultaneously improve the first resin board (3) and the second resin board (4) in chemical resistance.

According to another aspect of the present disclosure, the ceramic insulator layer (21A, 21B, 21C, 21D) is mainly composed of alumina or low temperature co-fired ceramic. This configuration serves to reduce a cost for manufacturing the ceramic board (2).

According to still another aspect of the present disclosure, the metal member (5) is a fixing tool. This configuration serves to provide a probe card wiring board more reliable in precision of wafer inspection.

According to still another aspect of the present disclosure, the ceramic insulator layer (21A, 21B, 21C, 21D) has a thermal expansion coefficient of $6 \times 10^{-6}$ m/K or less. This configuration further serves to suppress the entire wiring board (1) from warping.

The present disclosure is not limited to the embodiment described above, but may be implemented by various embodiments as follows. The wiring board 1 described above may be applied to devices other than probe cards. For example, the wiring board 1 may include conductive members such as leads, as the metal members 5 joined to the joint pads 43. Moreover, the first resin board 3 may be provided without the probe pads 32.

The embodiments described above may be modified by: replacing one of the components with a combination of components serving the same function; replacing some of the components with an integrated component serving the same functions; omitting some of the features; adding some of the features of another one of the embodiments; and/or replacing the features with some of the features of another one of the embodiments. The present disclosure may be implemented by any embodiments based on technical ideas defined by the following claims.

The entire contents of Japanese Patent Application 2018-160480 filed Aug. 29, 2018 are incorporated herein by reference.

What is claimed is:

1. A wiring board comprising:
a ceramic board including a ceramic insulator layer composed mainly of ceramic, and a wiring disposed at the ceramic insulator layer;
a first resin board and a second resin board each of which includes a resin insulator layer composed mainly of resin, and a wiring disposed at the resin insulator layer; and
a metal member mounted to the second resin board,
wherein:
the first resin board is superposed to a first surface of the ceramic board;
the second resin board is superposed to a second surface of the ceramic board opposite to the first surface of the ceramic board;
the second resin board includes a joint pad at its first surface opposite to its second surface facing the ceramic board, the joint pad made of metal;
the wiring board includes a joint metal that is a brazing material or a soldering material and the metal member is joined to the joint pad by brazing or soldering via the joint metal; and
the metal member is a fixing tool for fixing the wiring board to a test head of an inspector.

2. The wiring board according to claim 1, wherein the resin insulator layers of the first resin board and the second resin board are mainly composed of polyimide.

3. The wiring board according to claim 1, wherein the ceramic insulator layer is mainly composed of alumina or low temperature co-fired ceramic.

4. The wiring board according to claim 1, wherein the ceramic insulator layer has a thermal expansion coefficient of $6 \times 10^{-6}$ m/K or less.

* * * * *